United States Patent [19]
Arai

[11] Patent Number: 6,084,283
[45] Date of Patent: Jul. 4, 2000

[54] SEMICONDUCTOR DEVICE AND METHOD OF MANUFACTURING THE SAME

[75] Inventor: Norihisa Arai, Omiya, Japan

[73] Assignee: Kabushiki Kaisha Toshiba, Kawasaki, Japan

[21] Appl. No.: 09/017,802

[22] Filed: Feb. 3, 1998

[30] Foreign Application Priority Data

Feb. 4, 1997 [JP] Japan .................................. 9-021664

[51] Int. Cl.[7] .................................................. H01L 29/00
[52] U.S. Cl. .......................... 257/500; 257/336; 257/344; 257/408
[58] Field of Search ..................... 257/336, 344, 257/408, 500

[56] References Cited

U.S. PATENT DOCUMENTS

| | | | |
|---|---|---|---|
| 5,436,482 | 7/1995 | Ogoh ........................................ | 257/344 |
| 5,451,807 | 9/1995 | Fujita ....................................... | 257/404 |
| 5,585,658 | 12/1996 | Mukai et al. ............................ | 257/344 |
| 5,612,914 | 3/1997 | Liu et al. .............................. | 365/185.26 |
| 5,789,787 | 8/1998 | Kadosh et al. ........................... | 257/369 |
| 5,831,306 | 11/1998 | Gardner et al. .......................... | 257/344 |
| 5,877,531 | 3/1999 | Fukatsu et al. .......................... | 257/344 |

Primary Examiner—Jerome Jackson, Jr.
Assistant Examiner—George C. Eckert, II
Attorney, Agent, or Firm—Banner & Witcoff, Ltd.

[57] ABSTRACT

A high-breakdown voltage MOSFET has source and drain layers arranged to interpose a channel region therebetween in a channel-length direction and to have LDD portions having a low carrier-impurity concentration, respectively, on sides facing each other. A gate electrode faces the channel region through an insulating film. The LDD portion of the drain layer has a lower carrier-impurity concentration and a longer length in the channel-length direction, than those of the LDD portion of the source layer.

8 Claims, 12 Drawing Sheets

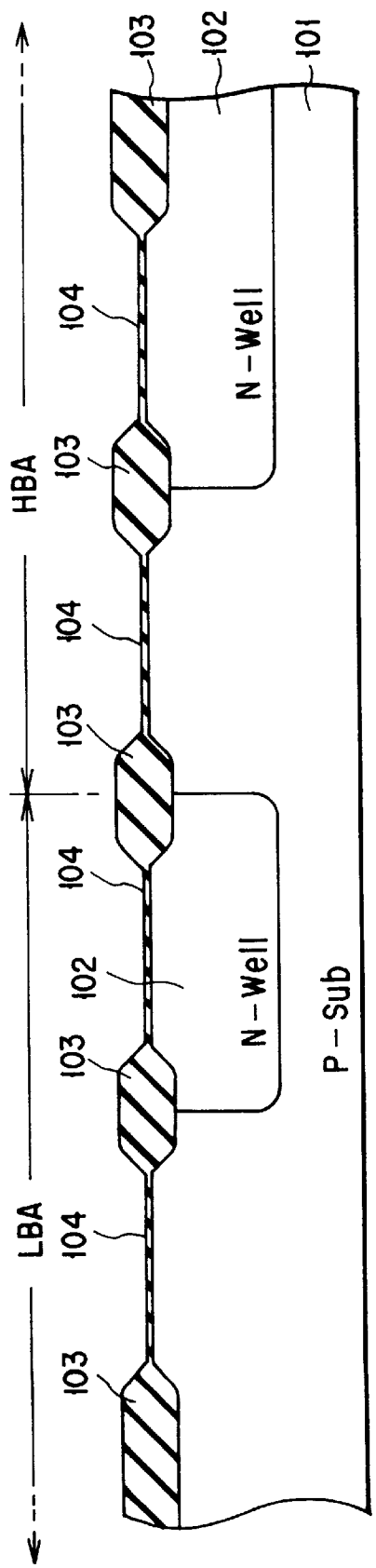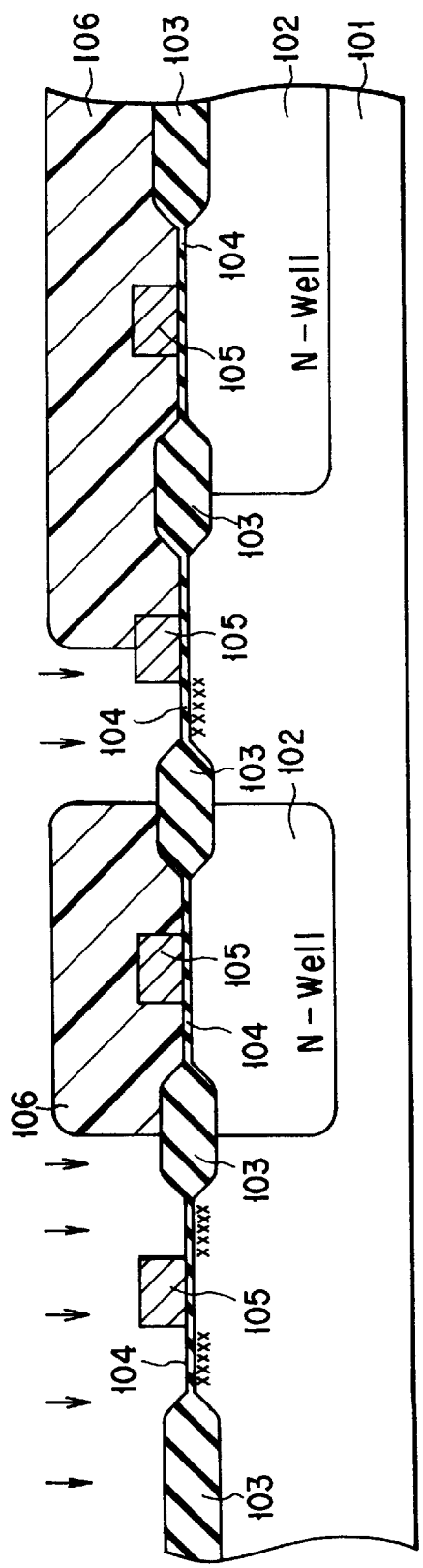
FIG. 1A
FIG. 1B

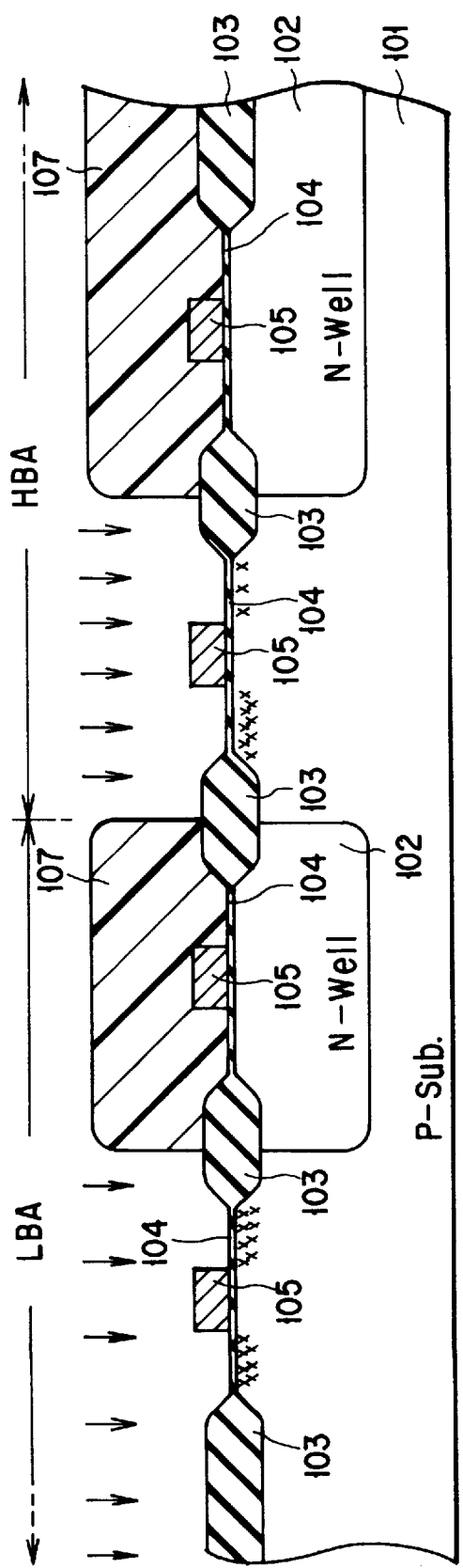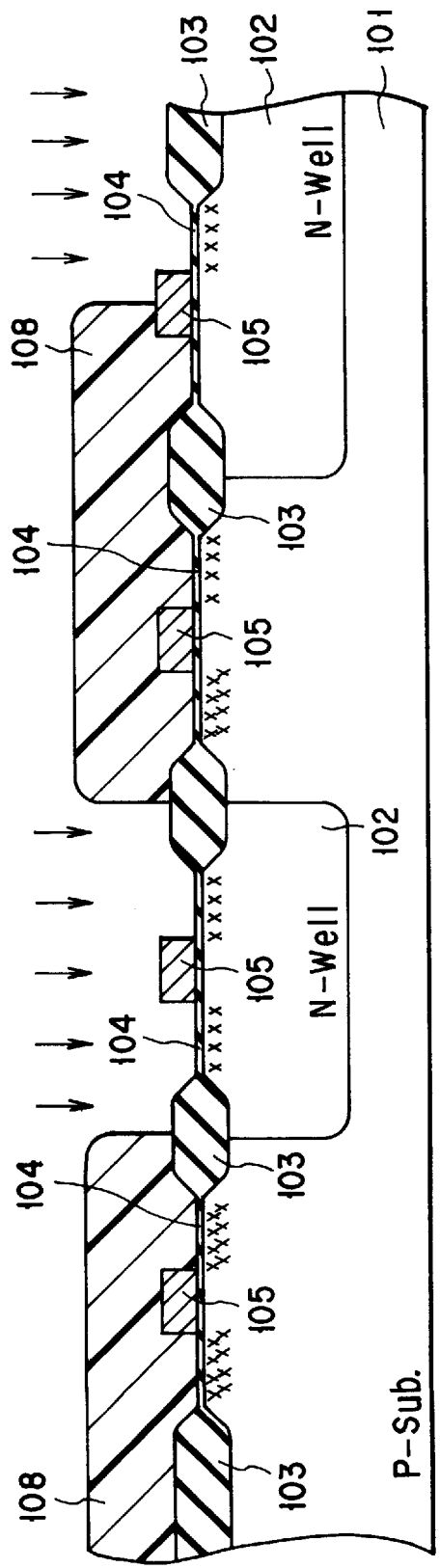
FIG. 2A
FIG. 2B

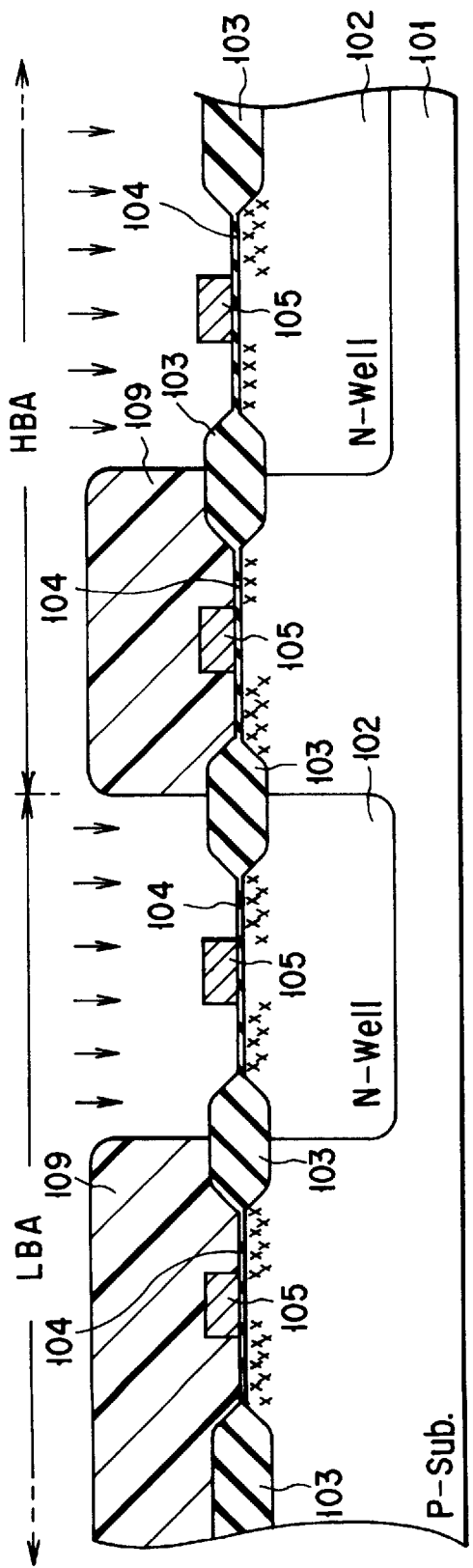
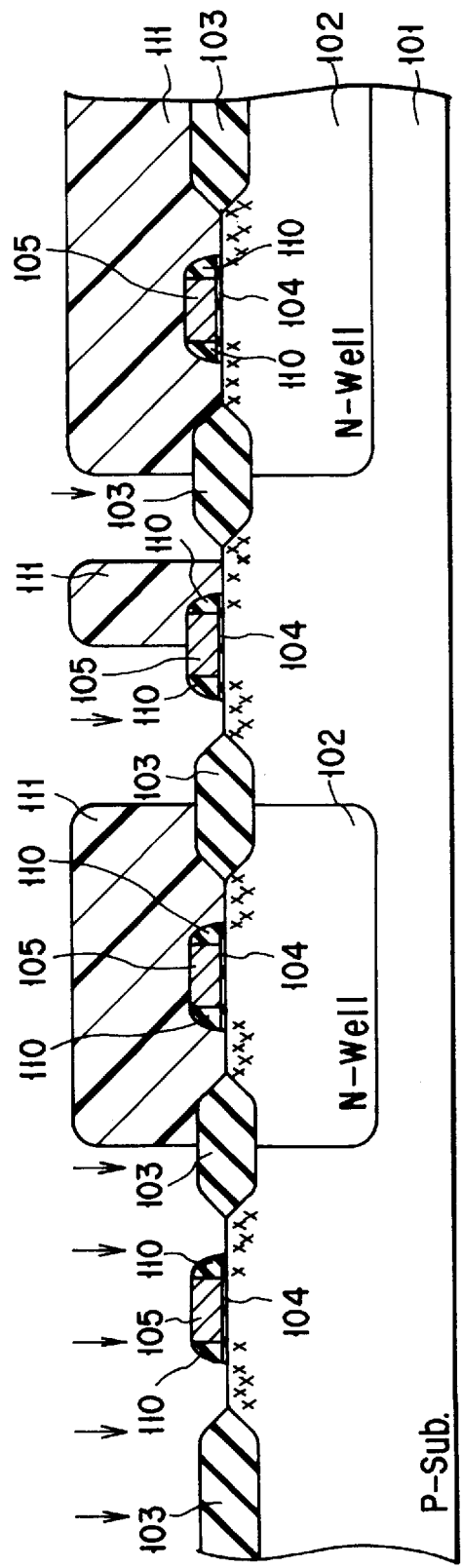
FIG. 3A
FIG. 3B

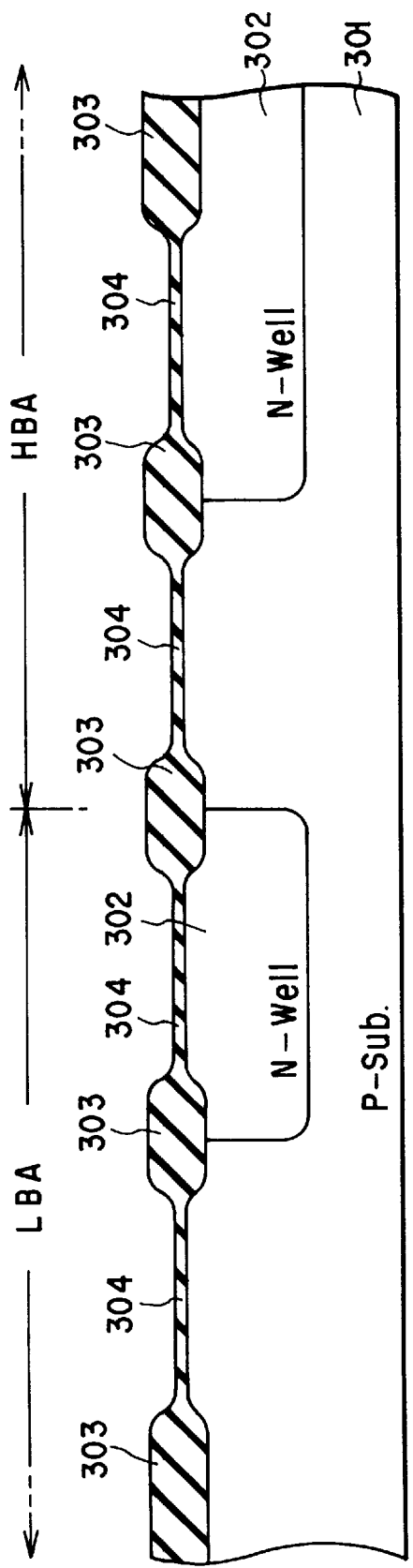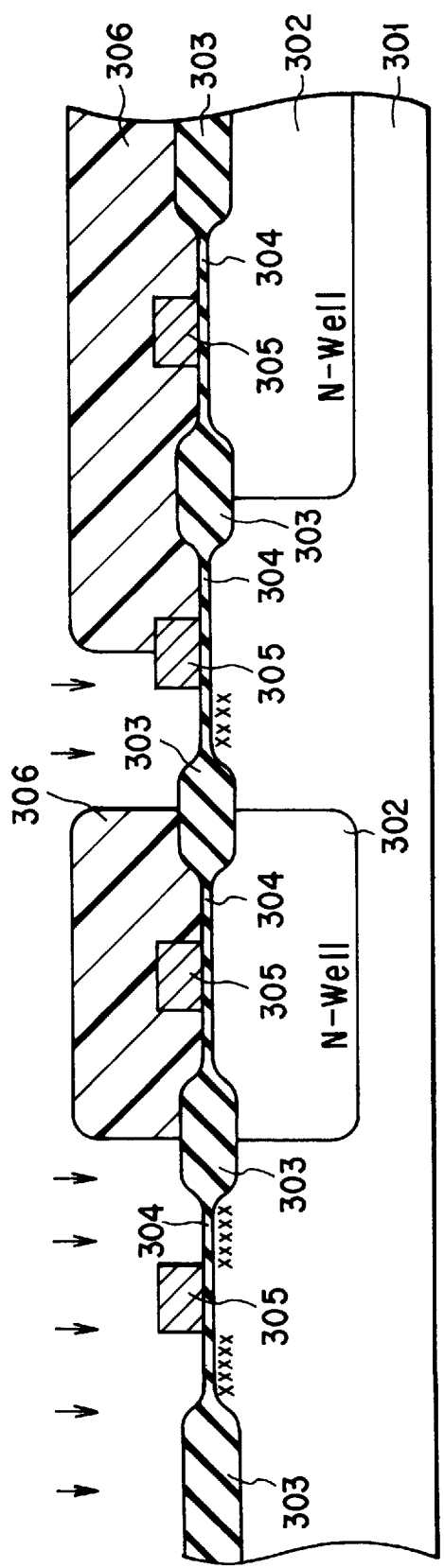

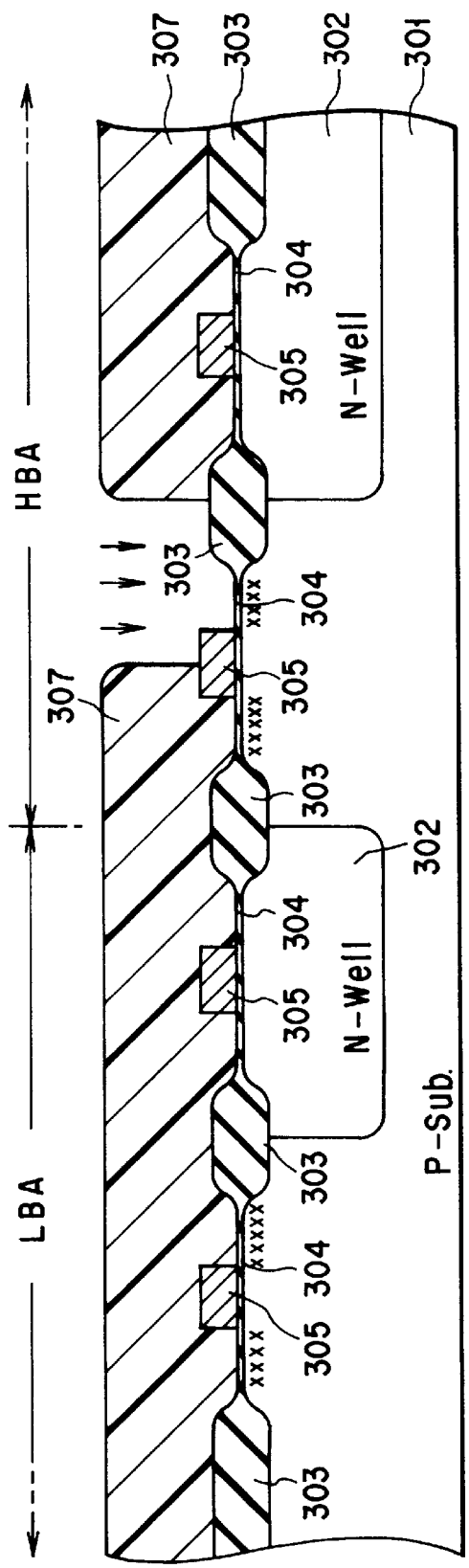
FIG. 9
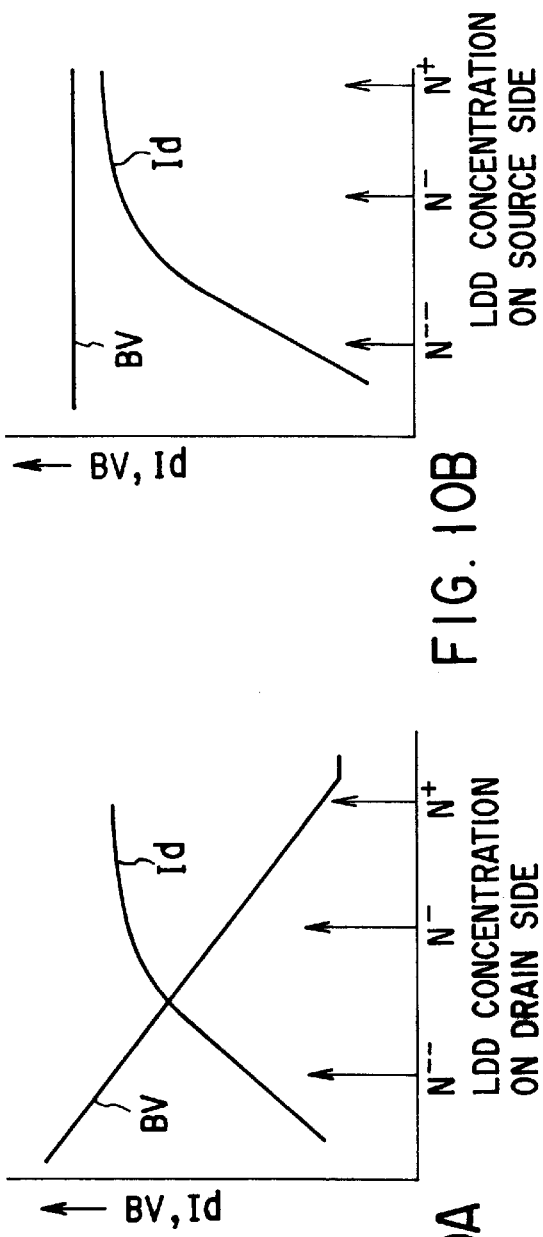
FIG. 10A
FIG. 10B

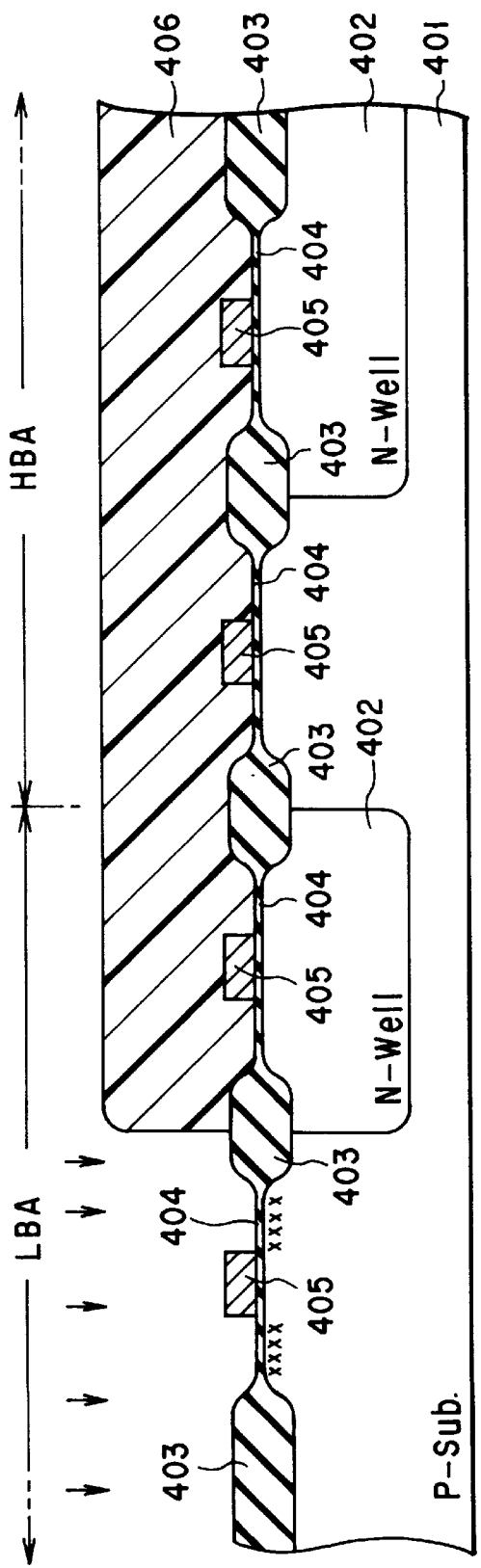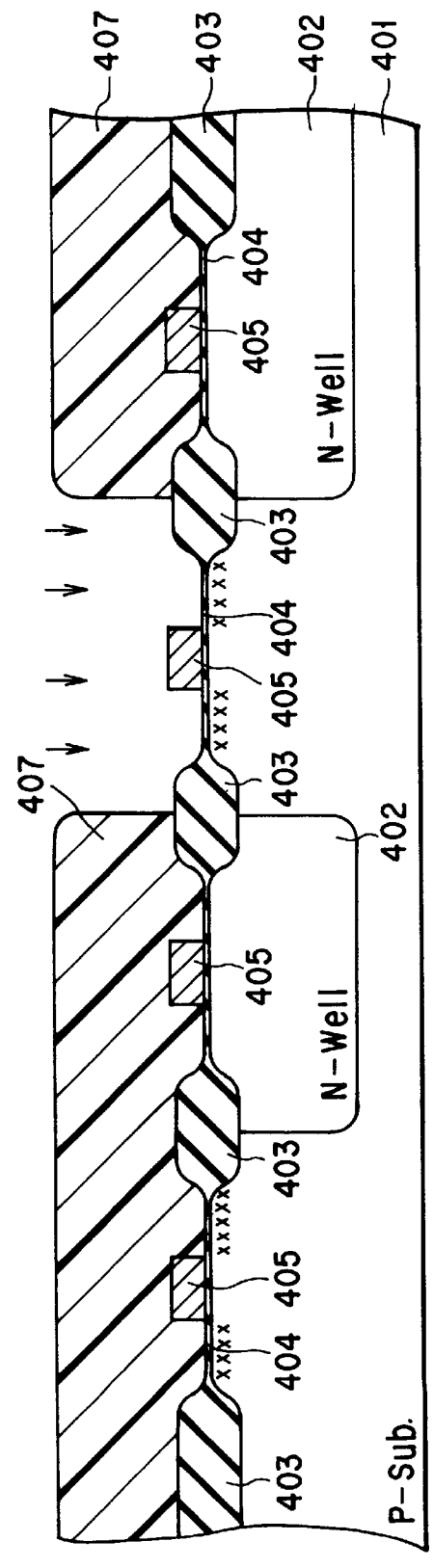
FIG. 11A
FIG. 11B

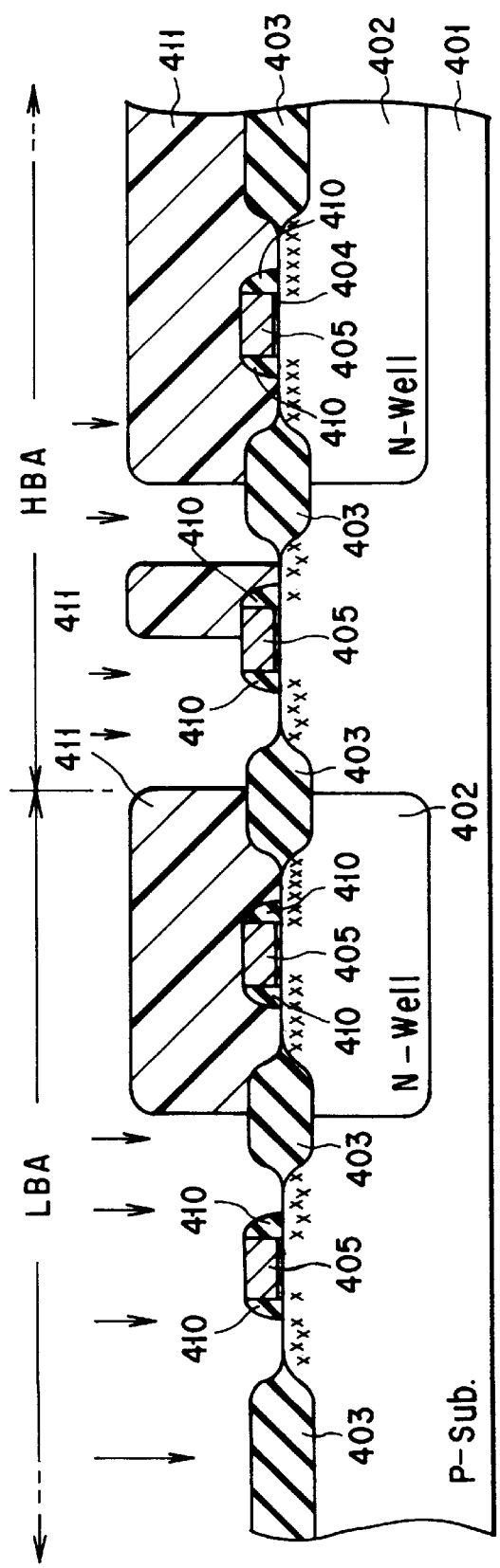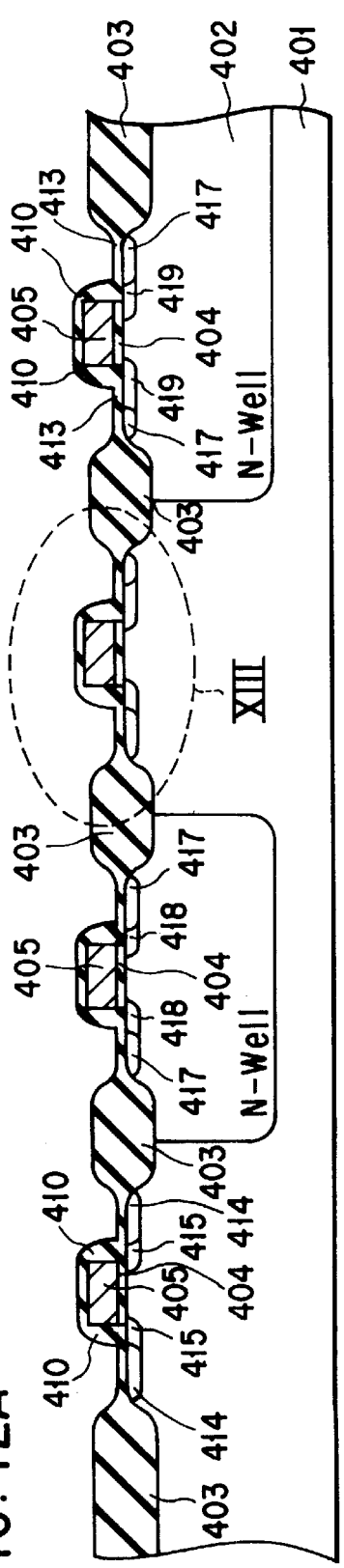
FIG. 12A
FIG. 12B

SEMICONDUCTOR DEVICE AND METHOD OF MANUFACTURING THE SAME

BACKGROUND OF THE INVENTION

The present invention relates to a semiconductor device containing circuit elements operated with a plurality of power supplies, such as a non-volatile memory, and a method of manufacturing the semiconductor device.

Generally, when data are written in or erased from a non-volatile memory, a power supply of about 12V, which is higher than that in a usual reading operation, is used. For this reason, circuits for transacting the writing and erasing operations require circuit elements of a high breakdown voltage which are capable of withstanding the high voltage. In contrast, a power supply of about 3.3V is used for performing the usual reading operation. Accordingly, a circuit only for transacting the reading operation requires no high-breakdown-voltage elements, but is satisfied with low-breakdown-voltage elements. As a result, in the non-volatile memory, high-breakdown-voltage elements and low-breakdown-voltage elements are mixedly present in one semiconductor device, i.e., a semiconductor chip.

On the other hand, a conventional logic device generally employs a power supply of 3.3V, and does not need such a high voltage as used in the non-volatile memory. Namely, hardly any high-breakdown-voltage elements are used in this device.

In recent years, demand for a logic device containing non-volatile memory cells is increasing in the market. Such a logic device, therefore, mixedly contains low-breakdown-voltage elements and the non-volatile memories having high-breakdown-voltage elements.

Generally, a MOSFET arranged in the logic device containing non-volatile memory cells adopts an LDD (Lightly Doped Drain) structure in order to prevent its reliability from lowering due to hot carriers (Reference Publication: Takeda, "Hot Carrier Effect", Nikkei-McGraw-Hill). With the LDD structure, it is possible not only to reduce the deterioration due to the hot carrier effect, but also to relax the electric field at the drain edge portion. Accordingly, the LDD structure is well-known as an indispensable technique for realizing a high-breakdown-voltage element.

In order to attain a preferable breakdown voltage in an LDD structure, an LDD portion, which is formed in a drain layer near an edge of the gate electrode and has a low carrier-impurity concentration, i.e., an increased resistivity, should have a sufficiently low concentration and a sufficiently large length (LDD length). The LDD length means the length of the LDD portion extending in the channel-length direction from the edge of the gate electrode. Where the length is large enough, it is possible to maintain a sufficiently low LDD concentration. For this reason, a high-breakdown-voltage element is provided with an LDD portion having a large LDD length and a low concentration of, e.g., $1 \times 10^{18}/cm^3$, which is lower than a generally used concentration of about $1 \times 10^{19}/cm^3$. Such an LDD portion of a low concentration will be referred to as $N^{--}$-LDD or $P^{--}$-LDD.

On the other hand, an LDD structure is adopted in a low-breakdown-voltage element to ensure reliability in relation to hot carriers. However, unlike the high-breakdown-voltage element, the low-breakdown-voltage element is provided with an LDD portion having a generally used concentration of about $1 \times 10^{19}/cm^3$. Such an LDD portion of a generally used concentration will be referred to as $N^{-}$-LDD or $P^{-}$-LDD. This is because, as is clear from FIGS. 10A and 10B which show dependency of the breakdown voltage BV and electric current (transistor-channel current) Id on LDD concentration in N-channel MOSFETs, the impurity concentration of an LDD portion has a great influence on the transistor-channel current Id. Specifically, a decrease in the impurity concentration in an LDD portion directly increases its parasitic resistance and lowers the channel current Id. Further, as the LDD length of the LDD portion is shorter, its parasitic resistance becomes smaller. For this reason, an LDD transistor of a side wall type is widely used as a structure for ensuring a small LDD length with a high controllability.

The above described explanation relates to general structures of high-breakdown-voltage and low-breakdown-voltage MOSFETs. As a method of manufacturing a semiconductor device mixedly containing these two types of MOSFETs, i.e., high-breakdown-voltage and low-breakdown-voltage MOSFETs, there is a conventional method shown in FIGS. 11A to 12B.

First, as shown in FIG. 11A, an N-well layer 402 for arranging a P-channel MOSFET, i.e., PMOSFET, in a P-semiconductor substrate 401, a silicon oxide film 403, a gate oxide film 404, and a gate electrode and wiring layer 405 are formed in this order by conventional steps. Then, a resist pattern 406 is formed to have an opening at a position corresponding to an N-channel MOSFET, i.e., NMOSFET, in a low-breakdown-voltage-element area LBA. Then, using the resist pattern 406 as a mask, an impurity for forming an $N^{-}$-LDD portion of the low-breakdown-voltage NMOSFET is ion-implanted.

Subsequently, the resist pattern 407 is removed, and, as shown in FIG. 11B, a resist pattern 407 is formed to have an opening at a position corresponding to an NMOSFET in a high-breakdown-voltage-element area HBA. Then, using the resist pattern 407 as a mask, an impurity for forming an $N^{--}$-LDD portion of the high-breakdown-voltage NMOSFET is ion-implanted. The impurity concentration of the $N^{--}$-LDD portion of the high-breakdown-voltage NMOSFET is set to be lower than that of the $N^{-}$-LDD portion of the low-breakdown-voltage NMOSFET.

Following the steps for the NMOSFETs and similarly thereto, impurities for forming LDD portions of PMOSFETs are separately ion-implanted to obtain different concentrations for the low- and high-breakdown-voltage sides, though detailed drawings showing these steps are omitted.

After that, as shown in FIG. 12A, side walls 410 are formed on the gate electrode 405. Then, a resist pattern 411 is formed to at least partly cover a position corresponding to a drain $N^{--}$-LDD portion of the high-breakdown-voltage NMOSFET. Then, using the resist pattern 411 as a mask, an impurity for forming $N^+$-diffusion layers is ion-implanted in the semiconductor substrate 401.

Similarly to the NMOSFETS, an impurity for forming $P^+$-diffusion layers of the PMOSFET is ion-implanted through a mask which at least partly covers a position corresponding to a drain $P^{--}$-LDD portion of the high-breakdown-voltage PMOSFET.

Subsequently, the substrate 401 is post-oxidized, so that an oxide film 413 is formed on the exposed surfaces of the substrate 401, and the ion-implanted impurities are diffused and activated to complete the drain and source layers of the MOSFETs. As a result, a structure shown in FIG. 12B is obtained.

In the structure shown in FIG. 12B, the drain layer of the high-breakdown-voltage NMOSFET is provided with the LDD portion having a relatively large LDD length, which has been given by the resist pattern 441. Further, the impurity doping, i.e., ion-implantation, for forming the drain N$^{--}$-LDD portion, which has a relatively low concentration, of the high-breakdown-voltage NMOSFET, can be selectively performed through the resist pattern 407.

On the other hand, the impurity doping, i.e., ion-implantation, for forming the N$^-$-LDD portions, which have a middle concentration, of the low-breakdown-voltage NMOSFET, can be selectively performed through the resist pattern 406. Since their LDD length is decided by the side walls 410 formed on the sides of the gate electrode, a small LDD length is obtained under high accurate control. As a result, the LDD portions of the low-breakdown-voltage NMOSFET can have a concentration relatively high enough to ensure reliability in relation to hot carriers, and further can have a small LDD length, so that the transistor is provided with a high reliability and a high channel current Id.

However, in the semiconductor device manufactured by the above described conventional method, an LDD portion 416 having a low concentration is formed on the source side of the high-breakdown-voltage MOSFET, where it does not work for the breakdown voltage (see FIG. 13 which shows a portion surrounded by a broken line in FIG. 12B). Since the LDD portion 416 is formed to have a very low concentration for ensuring a high breakdown voltage, it affects the MOSFET and deteriorates its channel current. As a result, the high-breakdown-voltage MOSFET cannot be driven at a high speed.

In order to solve this problem, there is a known method in which an N$^+$-impurity is ion-implanted at a high concentration only into the source layer of the high-breakdown-voltage NMOSFET (a P$^+$-impurity for the PMOSFET) in advance of the formation of the side walls 410. In this case, an N$^+$-impurity is ion-implanted at a high concentration into the drain layer of the high-breakdown-voltage NMOSFET and the drain and source layer of the low-breakdown-voltage NMOSFET (a P$^+$-impurity for the PMOSFETs) after the formation of the side walls 410, as in the method shown in FIGS. 11A to 12B. The high-breakdown-voltage MOSFET thus formed has a structure shown in FIG. 14, in which the end of the source layer has an enough increased impurity concentration, i.e., an decreased resistivity, to ignore its parasitic resistance. Further, on the other hand, the drain layer has an LDD portion of a large enough LDD length and a low enough impurity concentration to ensure a high breakdown voltage. As a result, the high-breakdown-voltage element is formed while its channel current is prevented from lowering, as far as possible.

However, in order to form the structure shown in FIG. 14, it is inevitably necessary to ion-implant an N$^+$-impurity at a high concentration into the source layer of the high-breakdown-voltage NMOSFET (a P$^+$-impurity for the PMOSFET) in advance, and thus to add a mask step and an ion-implantation step. For example, where the structure shown in FIG. 14 is adopted for both of the NMOSFET and the PMOSFET, it is necessary to add a mask step and an ion-implantation step for ion-implanting an N$^+$-impurity, and a mask step and an ion-implantation step for ion-implanting a P$^+$-impurity, as compared to the structure shown in FIG. 13. Accordingly, the manufacturing cost is seriously increased due to the added steps.

To reiterate, the conventional technique described above with reference to FIGS. 11A to 13 entails a problem such that a high-breakdown-voltage element lowers its performance to a great extent and hinders a semiconductor device in operating at a high speed. On the other hand, the conventional technique described above with reference to FIG. 14 entails a problem such that its complicated process increases the cost of manufacturing a semiconductor device.

BRIEF SUMMARY OF THE INVENTION

Therefore an object of the present invention is to provide a semiconductor device which mixedly contains a high-breakdown-voltage element and a low-breakdown-voltage element, but can be operated at a high speed with a high reliability.

Another object of the present invention is to provide a method of manufacturing a semiconductor device, which can simplify the process steps and decrease the cost.

According to a first aspect of the present invention, there is provided a semiconductor device including a field effect transistor, comprising:

a source layer and a drain layer formed in a common surface of a semiconductor substrate to interpose a channel region therebetween in a channel-length direction and have LDD portions having a low carrier-impurity concentration, respectively, on sides facing each other; and a gate electrode facing the channel region through an insulating film, wherein the LDD portion of the drain layer has a lower carrier-impurity concentration and a longer length in the channel-length direction, than those of the LDD portion of the source layer.

According to a second aspect of the present invention, there is provided a semiconductor device comprising:

(a) a first transistor formed of a field effect transistor of a first conductivity channel, and comprising a first source layer and a first drain layer formed in a common surface of a semiconductor substrate to interpose a first channel region therebetween in a first channel-length direction and have LDD portions having a low carrier-impurity concentration, respectively, on sides facing each other, and a first gate electrode facing the first channel region through an insulating film, wherein the LDD portion of the first drain layer has a carrier-impurity concentration and a length in the first channel-length direction, the same as those of the LDD portion of the first source layer; and (b) a second transistor formed of a field effect transistor of a first conductivity channel, and comprising a second source layer and a second drain layer formed in the common surface of the semiconductor substrate to interpose a second channel region therebetween in a second channel-length direction and have LDD portions having a low carrier-impurity concentration, respectively, on sides facing each other, and a second gate electrode facing the second channel region through an insulating film, wherein the LDD portion of the second drain layer has a lower carrier-impurity concentration and a longer length in the second channel-length direction, than those of the LDD portion of the second source layer.

According to a third aspect of the present invention, there is provided a semiconductor device comprising:

(a) the first transistor of the second aspect;

(b) the second transistor of the second aspect;

(c) a third transistor formed of a field effect transistor of a second conductivity channel, the first and third transistors constituting a first complementary pair, the third transistor comprising a third source layer and a third drain layer formed in the common surface of the semiconductor substrate to interpose a third channel region therebetween in a third channel-length direction and have LDD portions having a low carrier-impurity concentration, respectively, on sides facing each other, and a third gate electrode facing the third channel region through an insulating film, wherein the LDD portion of the third drain layer has a carrier-impurity concentration and a length in the third channel-length direction, the same as those of the LDD portion of the third source layer; and (d) a fourth transistor formed of a field effect transistor of a second conductivity channel, the second and fourth transistors constituting a second complementary pair, the fourth transistor comprising a fourth source layer and a fourth drain layer formed in the common surface of the semiconductor substrate to interpose a fourth channel region therebetween in a fourth channel-length direction and have LDD portions having a low carrier-impurity concentration, respectively, on sides facing each other, and a fourth gate electrode facing the fourth channel region through an insulating film, wherein the LDD portion of the fourth drain layer has a lower carrier-impurity concentration and a longer length in the fourth channel-length direction, than those of the LDD portion of the fourth source layer.

According to a fourth aspect of the present invention, there is provided a method of manufacturing the semiconductor device of the second aspect, the method comprising the steps of:

forming the first and second gate electrodes above the common surface;

introducing a first carrier impurity of a first conductivity type, at a first dose, into positions of the common surface, which correspond to the first source and drain layers and the second source layer;

introducing a second carrier impurity of the first conductivity type, at a second dose lower than the first dose, into a position of the common surface, which corresponds to the second drain layer;

forming insulating side walls on opposite sides of each of the first and second gate electrodes, the opposite sides facing positions of the common surface, which correspond to the LDD portions, respectively;

forming a resist pattern to cover, in cooperation with one of the side walls, a position of the common surface, which corresponds to the LDD portion of the second drain layer; and introducing a third carrier impurity of the first conductivity type, at a third dose higher than the first dose, into positions of the common surface, which correspond to the first source and drain layers and the second source and drain layers, while using the side walls and the resist pattern as a mask.

According to a fifth aspect of the present invention, there is provided a method of manufacturing the semiconductor device of the third aspect, the method comprising the steps of:

forming the first to fourth gate electrodes above the common surface;

forming a first resist pattern to cover positions of the common surface, which correspond to the third and fourth transistors and the second drain layer;

introducing a first carrier impurity of a first conductivity type, at a first dose, into positions of the common surface, which correspond to the first source and drain layers and the second source layer, while using the first resist pattern as a mask;

forming a second resist pattern to cover at least positions of the common surface, which correspond to the third and fourth transistors;

introducing a second carrier impurity of the first conductivity type, at a second dose lower than the first dose, into at least a position of the common surface, which corresponds to the second drain layer, while using the second resist pattern as a mask;

forming a third resist pattern to cover positions of the common surface, which correspond to the first and second transistors and the fourth drain layer;

introducing a third carrier impurity of a second conductivity type, at a third dose, into positions of the common surface, which correspond to the third source and drain layers and the fourth source layer, while using the third resist pattern as a mask;

forming a fourth resist pattern to cover at least positions of the common surface, which correspond to the first and second transistors;

introducing a fourth carrier impurity of the second conductivity type, at a fourth dose lower than the third dose, into at least a position of the common surface, which corresponds to the fourth drain layer, while using the fourth resist pattern as a mask;

forming insulating side walls on opposite sides of each of the first to fourth gate electrodes, the opposite sides facing positions of the common surface, which correspond to the LDD portions, respectively;

forming a fifth resist pattern to cover positions of the common surface, which correspond to the third and fourth transistors, and to cover, in cooperation with one of the side walls, a position of the common surface, which corresponds to the LDD portion of the second drain layer;

introducing a fifth carrier impurity of the first conductivity type, at a fifth dose higher than the first dose, into positions of the common surface, which correspond to the first source and drain layers and the second source and drain layers, while using the side walls and the fifth resist pattern as a mask;

forming a sixth resist pattern to cover positions of the common surface, which correspond to the first and second transistors, and to cover, in cooperation with one of the side walls, a position of the common surface, which corresponds to the LDD portion of the fourth drain layer; and introducing a sixth carrier impurity of the second conductivity type, at a sixth dose higher than the third dose, into positions of the common surface, which correspond to the third source and drain layers and the fourth source and drain layers, while using the side walls and the sixth resist pattern as a mask.

Preferably, the transistor of the first aspect and the second and fourth transistor of the second to fifth aspects are arranged in a high-breakdown-voltage-element area, and the first and third transistor of the second to fifth aspects are arranged in a low-breakdown-voltage-element area.

Note that, the term, a carrier impurity, means an impurity for providing a semiconductor layer with carriers, and materials simply referred to as an impurity hereinafter all denote a carrier impurity.

According to a semiconductor device of the present invention, a high-breakdown-voltage transistor has source and drain layers whose LDD portions satisfy the above described specific relationships, so that the device ensures a high speed operation and a high reliability. Further, a low-breakdown-voltage transistor has source and drain layers whose LDD portions have an impurity concentration not so low and a small LDD length, so that the device ensures a high reliability in relation to hot carriers and also a high transistor-channel current.

According to a manufacturing method of the present invention, a semiconductor device of the present invention can be manufactured without increasing the number of its manufacturing steps and cost. More specifically, a high-breakdown-voltage transistor is provided with a drain layer whose LDD portion has a low impurity concentration and a preferable LDD length necessary for ensuring a high breakdown voltage. The high-breakdown-voltage transistor is also provided with a source layer whose LDD portion has a middle impurity concentration necessary for a sufficient channel current, though there is a limit in the concentration to ensure a reliability in relation to hot carriers. On the other hand, a low-breakdown-voltage transistor is provided with source and drain layers whose LDD portions have a middle impurity concentration and a small LDD length equal to the length of a side wall. Accordingly, there is hardly any parasitic resistance due to the LDD portion of the source layer of a low-breakdown-voltage transistor.

Note that, in addition to MOSFETs, the present invention may be similarly applied to MISFETs which employ a gate insulating film formed of an insulating film other than an oxide film. Further, the present invention is similarly applied to P-channel and N-channel structures, and in particular, is effective for a semiconductor device having a CMOS structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are cross-sectional views showing steps in a method of manufacturing a semiconductor device according to a first embodiment of the present invention;

FIGS. 2A and 2B are cross-sectional views showing steps, which follow the steps shown in FIGS. 1A and 1B, in the method of manufacturing a semiconductor device according to the first embodiment of the present invention;

FIGS. 3A and 3B are cross-sectional views showing steps, which follow the steps shown in FIGS. 2A and 1B, in the method of manufacturing a semiconductor device according to the first embodiment of the present invention;

FIGS. 8A and 8B are cross-sectional views showing steps in a method of manufacturing a semiconductor device according to a third embodiment of the present invention;

FIG. 9 is a cross-sectional view showing a step, which follows the steps shown in FIGS. 8A and 8B, in the method of manufacturing a semiconductor device according to the third embodiment of the present invention;

FIGS. 10A and 10B are views showing dependency of the breakdown voltage BV and channel current Id on LDD concentration in NMOSFETs having a conventional LDD structure;

FIGS. 11A and 11B are cross-sectional views showing steps of a conventional method of manufacturing a semiconductor device;

FIGS. 12A and 12B are cross-sectional views showing steps, which follow the steps shown in FIGS. 11A and 11B, of the conventional method of manufacturing a semiconductor device;

DETAILED DESCRIPTION OF THE INVENTION

Figure 4A:
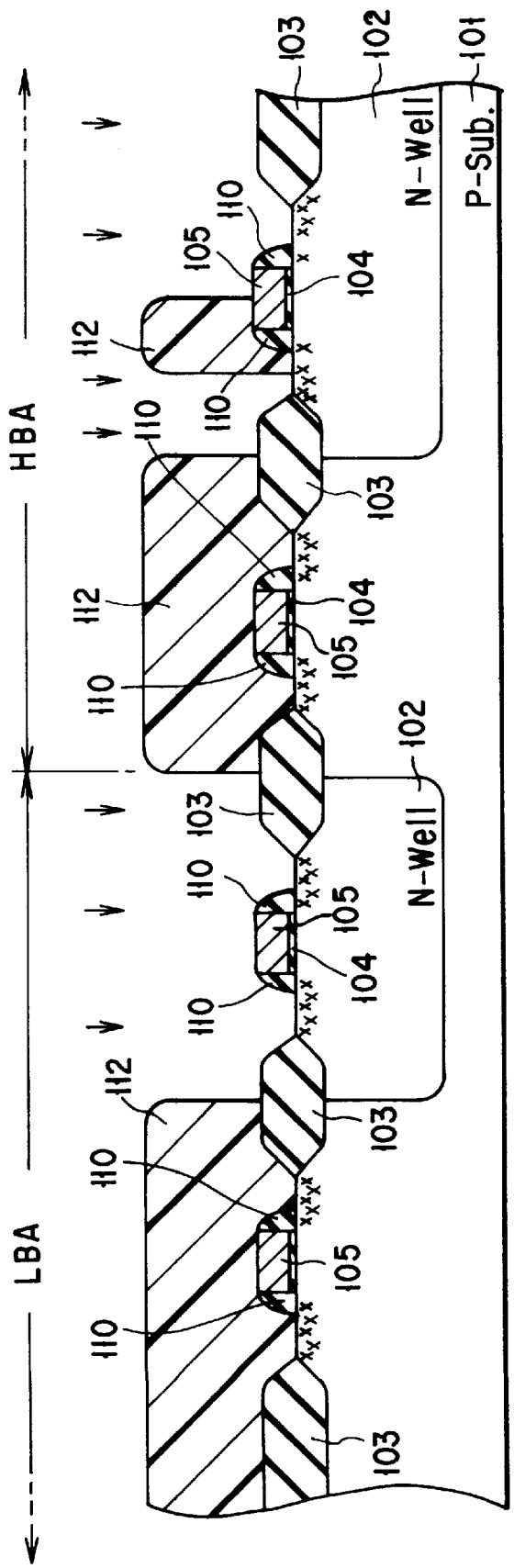
FIGS. 4A and 4B are cross-sectional views showing steps, which follow the steps shown in FIGS. 3A and 3B, in the method of manufacturing a semiconductor device according to the first embodiment of the present invention.
Figure 4B:
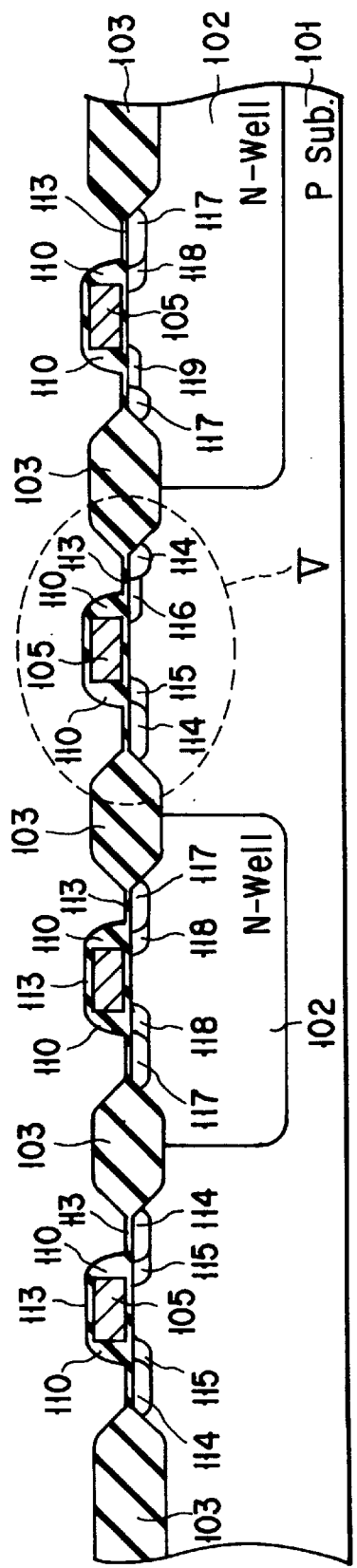

FIGS. 1A and 4B are cross-sectional views showing the order of steps in a method of manufacturing a semiconductor device according to a first embodiment of the present invention. Preferably, this embodiment is applied to, for example, a peripheral circuit of a flash EEPROM.

First, as shown in FIG. 1A, N-well layers 102 for arranging P-channel MOSFETs, i.e., PMOSFETs, in a P-semiconductor substrate, i.e., a silicon substrate 101, are formed in both a high-breakdown-voltage-element area HBA and a low-breakdown-voltage-element area LBA. Then, an isolation oxide film 103 having a thickness of about 600 nm is formed on a surface of the silicon substrate 101 by means of a LOCOS method. Then, a silicon oxide film 104 having a thickness of about 15 nm is formed on the surface of the silicon substrate 101 by means of heat oxidation.

Subsequently, a poly-silicon film to be used as a gate electrode material and having a thickness of about 400 nm is deposited by means of an LP-CVD method. Then, a resist is applied, light-exposed, and developed to form a resist pattern. Then, using the resist pattern as a mask, the poly-silicon film is selectively etched to form a gate electrode and wiring pattern 105.

Subsequently, a resist pattern 106 is formed to cover at least positions corresponding to the PMOSFETs and the drain diffusion layer of a high-breakdown-voltage NMOSFET. Then, using the resist pattern 106 as a mask, phosphorous ions are implanted into the substrate 101 at an acceleration energy of 45 KeV and a dose of $1 \times 10^{14}/cm^2$. As a result, a structure shown in FIG. 1B is obtained.

After the resist pattern 106 is removed, a resist pattern 107 is formed to cover at least positions corresponding to the PMOSFETs. Then, using the resist pattern 107 as a mask, phosphorous ions are implanted into the substrate 101 at an acceleration energy of 45 KeV and a dose of $1 \times 10^{13}/cm^2$. As a result, a structure shown in FIG. 2A is obtained.

In this state, phosphorous ions have been implanted, at a total dose of $1.2 \times 10^{14}/cm^2$ through the steps shown in FIGS. 1B and 2A, into positions corresponding to the source diffusion layer of the NMOSFET in the high-breakdown-voltage-element area HBA and to the low-breakdown-voltage NMOSFET. On the other hand, phosphorous ions have been implanted at a low dose of $2 \times 10^{13}/cm^2$ in the step shown in FIG. 2A, into a position corresponding to the drain diffusion layer of the NMOSFET in the high-breakdown-voltage-element area HBA.

Following the steps for the NMOSFETs and similarly thereto, a resist pattern 108 is formed to cover at least positions corresponding to the NMOSFETs and the drain diffusion layer of a high-breakdown-voltage PMOSFET. Then, using the resist pattern 108 as a mask, $BF_2$ ions are implanted into the substrate 101 at an acceleration energy of 45 KeV and a dose of $1 \times 10^{14}/cm^2$ (FIG. 2B).

After the resist pattern 106 is removed, a resist pattern 109 is formed to cover at least positions corresponding to the NMOSFETs. Then, using the resist pattern 109 as a mask, boron ions are implanted into the substrate 101 at an acceleration energy of 20 KeV and a dose of $1 \times 10^{13}/cm^2$ (FIG. 3A).

Subsequently, the resist pattern 109 is removed, and a silicon oxide film to be used as a side wall material and having a thickness of about 150 nm is formed by means of a conventional LP-CVD technique. Then, the silicon oxide film is etched back to form side walls 110 by means of an anisotropic etching technique. Then, a resist pattern 111 is formed to cover positions corresponding to the PMOSFETs, and continuous portions of the drain diffusion layer of the high-breakdown-voltage NMOSFET and the adjacent gate electrode. Then, using the resist pattern 111 as a mask, arsenic ions are implanted into the substrate 101 at an acceleration energy of 50 KeV and a dose of $1 \times 10^{16}/cm^2$ (FIG. 3B).

At this time, the resist pattern 111 covers a position corresponding to the drain diffusion layer of the high-breakdown-voltage NMOSFET on its gate electrode side by about 0.7 μm. Accordingly, the arsenic ions of a high concentration are not implanted right under the resist pattern 111, so that a relatively large LDD length is ensured to be a predetermined length. On the other hand, at a position corresponding to the drain diffusion layer of the low-breakdown-voltage NMOSFET, the arsenic ions of a high concentration are not implanted right under the side wall 110. As a result, a short LLD length is ensured with a high controllability.

Following the steps for the NMOSFETs and similarly thereto, a resist pattern 112 is formed to cover positions corresponding to the NMOSFETs, and continuous portions of the drain diffusion layer of the high-breakdown-voltage PMOSFET and the adjacent gate electrode. Then, using the resist pattern 112 as a mask, $BF_2$ ions are implanted into the substrate 101 at an acceleration energy of 20 KeV and a dose of $8 \times 10^{15}/cm^2$ (FIG. 4A).

After the resist pattern 112 is removed, a post oxide film 113 having a thickness of 25 nm is formed by means of heat oxidation in a dry $O_2$ atmosphere at 950° C. At this time, the ion-implanted impurities for forming the source and drain layers are diffused and activated, so as to form an $N^+$-diffusion layer 114 of a high concentration, an $N^-$-LDD layer 115 of a middle concentration, an $N^{---}$-LDD layer 116 of a low concentration lower than that of the $N^-$-LDD layer 115, a $P^+$-diffusion layer 117 of a high concentration, an $P^-$-LDD layer 118 of a middle concentration, an $P^{---}$-LDD layer 119 of a low concentration lower than that of the $P^-$-LDD layer 118. As a result, the NMOSFET in the high-breakdown-voltage-element area HBA is formed to have a structure shown in FIG. 5, which corresponds to a portion surrounded by the broken line in FIG. 4B.

Figure 5:
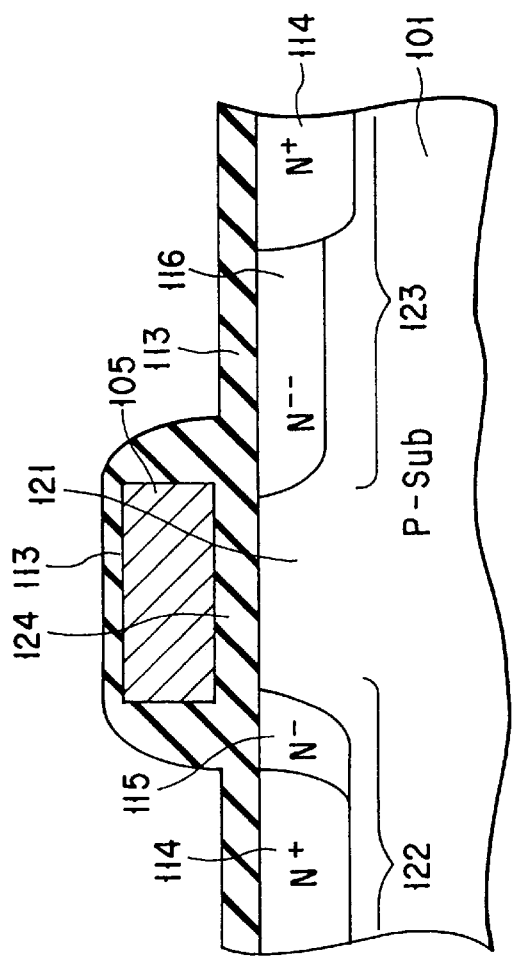
FIG. 5 is an enlarged cross-sectional view showing a part of FIG. 4.

As shown in FIG. 5, this NMOSFET has a source layer 122 and a drain layer 123 formed in a common surface of a semiconductor substrate to interpose a channel region 121 therebetween in a channel-length direction. A gate electrode 105 faces the channel region 121 through an insulating film 124. The source and drain layers 122 and 123 have LDD portions 115 and 116, respectively, on their facing sides, which have a low impurity concentration, i.e., an increased resistivity, as compared to their main diffusion layers 114. The LDD portion 116 of the drain layer 123 has a lower impurity concentration, i.e., a higher resistivity, than the LDD portion 115 of the source layer 122. Further, in the channel-length direction, the LDD portion 116 of the drain layer 123 is longer than the LDD portion 115 of the source layer 122. In the channel-length direction, the LDD portion 115 of the source layer 122 has a length substantially the same as that of the side wall formed on one side or the adjacent side of the gate electrode 105, while the LDD portion 116 of the drain layer 123 has a length larger than that of the side wall formed on the other side or the adjacent side of the gate electrode 105. These relations are completely the same in the PMOSFET in the high-breakdown-voltage-element area HBA.

Following the above described steps, a passivation film is deposited, and contact holes and Al wiring layers are sequentially formed to complete the peripheral circuit of the flash EEPROM, though detailed drawings showing these steps are omitted.

According to the first embodiment, the source diffusion layer of each MOSFET in the high-breakdown-voltage-element area HBA is controlled to be provided with an LDD portion of a middle concentration. For example, the source diffusion layer of the NMOSFET is provided with an LDD portion having a low sheet resistivity of several hundreds $\Omega/\square$, and only arranged right under the side wall, which has a short length of less than 15 nm. Accordingly, the parasitic capacitance on the source side can hardly have any influence on the transistor-channel current. In contrast, the drain layer of each MOSFET in the high-breakdown-voltage-element area HBA is controlled to be provided with an LDD portion of a low concentration. Further, since this LDD portion is controlled to have an LDD length as relatively long as about 0.7 μm by means of the resist pattern 111 or 112, an element having a desired high breakdown voltage of about 15V can be realized.

In consideration of a high breakdown voltage, reliability in relation to hot carriers, and a high channel current, it is preferable that specific impurity concentrations of such LDD structures are designed as follows. Namely, the $N^+$-layer 114 and $P^+$-layer 117 have a concentration of the order of $10^{21}/cm^3$ to have a low resistivity. The $N^-$-LDD layer 115 and the $P^-$-LDD layer 118 have a concentration of the order of $10^{20}/cm^3$ to have a middle resistivity. The $N^{---}$-LDD layer 116 and the $P^{---}$-LDD layer 119 have a concentration of the order of $10^{19}/cm^3$ to obtain a high breakdown voltage.

Figure 14:
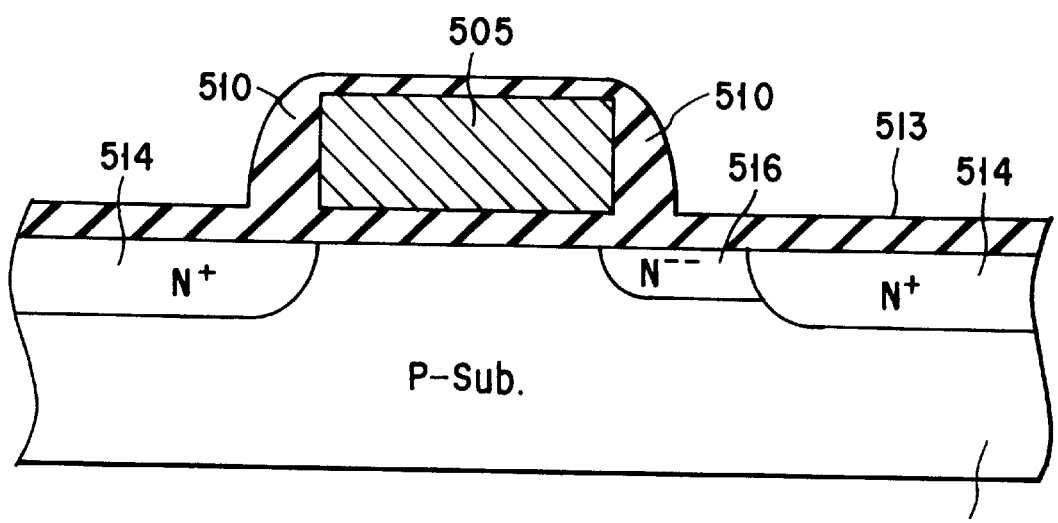
FIG. 14 is a cross-sectional view showing a conventional modification of the structure shown in FIG. 13.

Even if the method explained with reference to FIG. 14 is adopted, a circuit element similarly having a high transistor-channel current and a high breakdown voltage can be realized. However, the method of FIG. 14 requires a step of ion-implanting a high concentration $N^+$ for the source diffusion layer of the high-breakdown-voltage NMOSFET ($P^+$ for the PMOSFET), in advance of the formation of the side walls. In contrast, this embodiment of the present invention requires no such ion-implanting step, and thus prevents the mask step and the ion-implanting step necessary in the method of FIG. 14 from being added.

As described above, according to the first embodiment, it is possible to realize a semiconductor device which can operate at a high speed with a high reliability (high breakdown voltage), achieving this improvement without increasing its manufacturing cost.

Figure 6A:
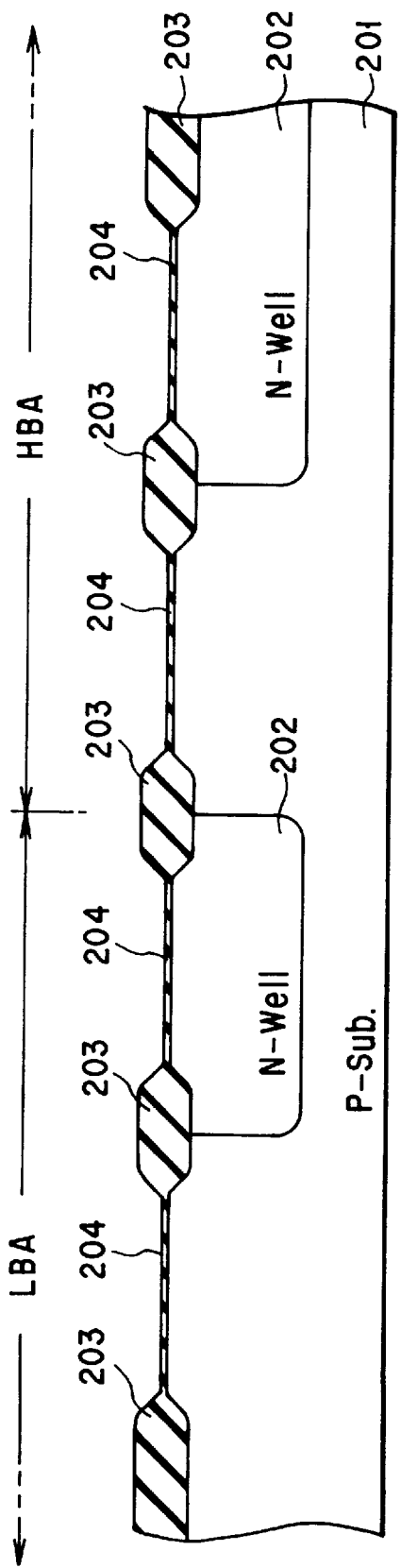
FIGS. 6A and 6B are cross-sectional views showing steps in a method of manufacturing a semiconductor device according to a second embodiment of the present invention.
Figure 7:
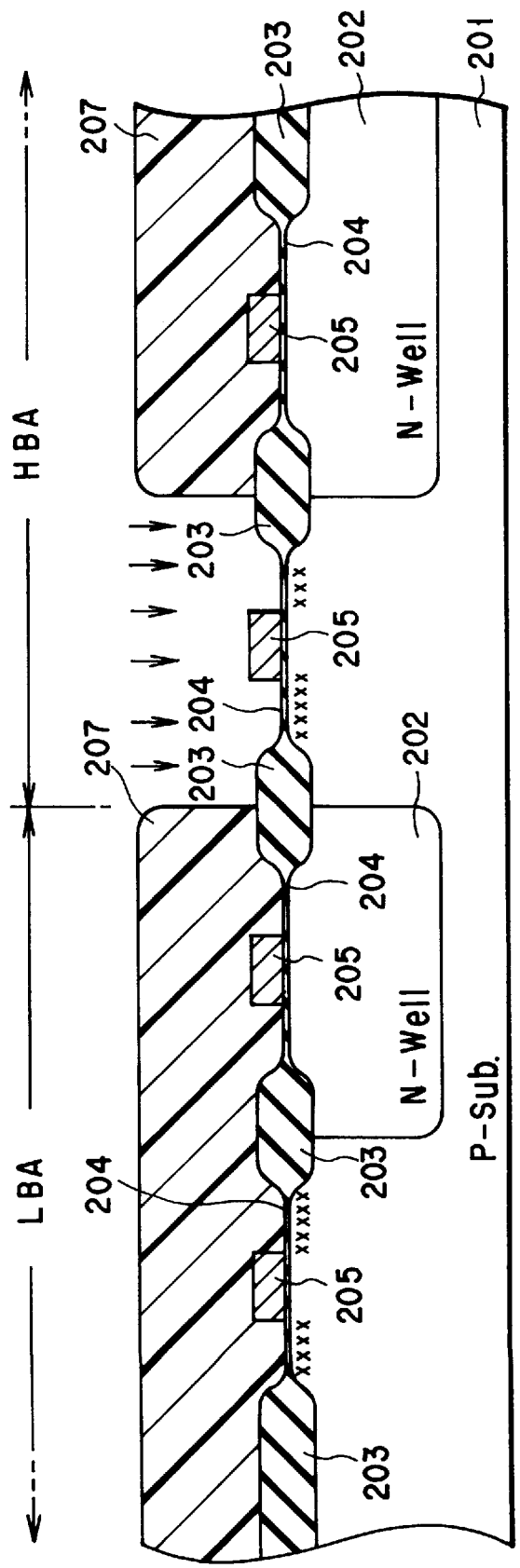
FIG. 7 is a cross-sectional view showing a step, which follows the steps shown in FIGS. 6A and 6B, in the method of manufacturing a semiconductor device according to the second embodiment of the present invention.
Figure 13:
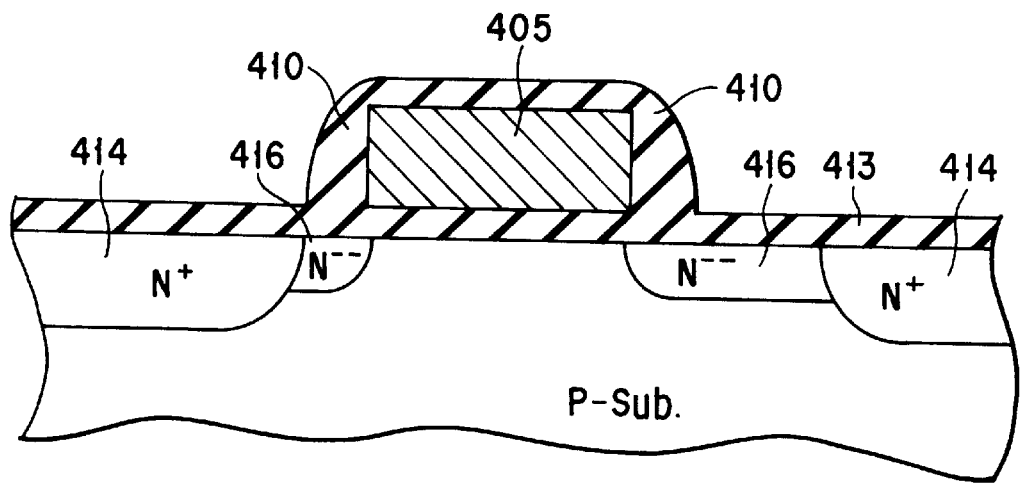
FIG. 13 is an enlarged cross-sectional view showing a part of FIG. 12B.

FIGS. 6A and 7 are cross-sectional views showing the order of steps in a method of manufacturing a semiconductor device according to a second embodiment of the present invention. Preferably, this embodiment is also applied to a peripheral circuit of a flash EEPROM.

First, through steps the same as the corresponding ones of the first embodiment, N-well layers 202 for arranging PMOSFETs in a P-semiconductor substrate, i.e., a silicon substrate 201, are formed in both a high-breakdown-voltage-element area HBA and a low-breakdown-voltage-element area LBA. Then, an isolation oxide film 203 is formed, and a silicon oxide film 204 having a thickness of about 15 nm is further formed on the surface of the silicon substrate 201 (FIG. 6A).

Figure 6B:
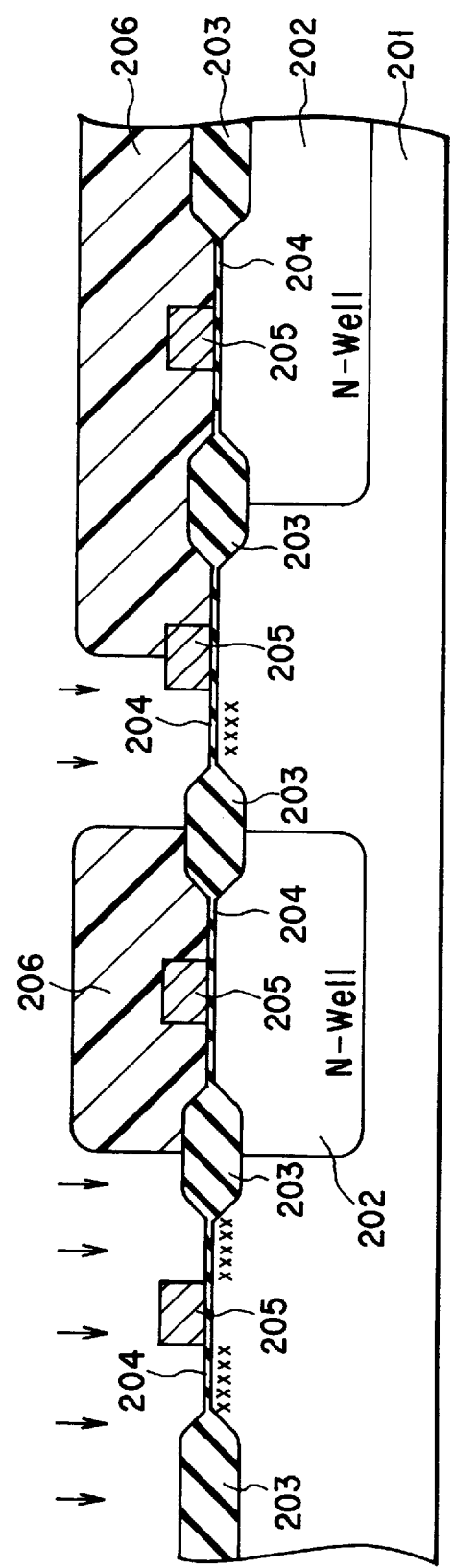

Subsequently, through steps the same as the corresponding ones of the first embodiment, a gate electrode and wiring pattern 205 is formed by means of etching. Then, a resist pattern 206 is formed to cover at least positions corresponding to the PMOSFETs and the drain diffusion layer of a high-breakdown-voltage NMOSFET. Then, using the resist pattern 206 as a mask, phosphorous ions are implanted into the substrate 201 at an acceleration energy of 45 KeV and a dose of $1 \times 10^{14}/cm^2$ (FIG. 6B).

After the resist pattern 206 is removed, a resist pattern 207 is formed to cover at least positions corresponding to the low-breakdown-voltage-element area LBA as well as the PMOSFETs. Then, using the resist pattern 207 as a mask, phosphorous ions are implanted into the substrate 201 at an acceleration energy of 45 KeV and a dose of $1 \times 10^{13}/cm^2$ (FIG. 7).

Following the above described steps, the steps shown in FIGS. 2B to 4B are performed to complete the peripheral circuit of the flash EEPROM, though detailed drawings showing these steps are omitted.

In the first embodiment, phosphorous ions are implanted, at a total dose of $1.2 \times 10^{14}/cm^2$ through the steps shown in FIGS. 1B and 2A, into positions corresponding to the source diffusion layer of the NMOSFET in the high-breakdown-voltage-element area HBA and to the source and drain diffusion layers of the NMOSFET in the low-breakdown-voltage-element area LBA. On the other hand, in the second embodiment, phosphorous ions are implanted into the position corresponding to the source diffusion layer of the NMOSFET in the high-breakdown-voltage-element area HBA at a dose the same as that of the first embodiment through the corresponding steps. However, in the second embodiment, phosphorous ions are implanted into the positions corresponding to the source and drain diffusion layers of the NMOSFET in the low-breakdown-voltage-element area HBA at a dose of $1.0 \times 10^{14}/cm^2$ only in the step shown in FIG. 6B, rather than a dose of $1.2 \times 10^{14}/cm^2$.

According to the second embodiment, therefore, the high-breakdown-voltage elements can be designed without reference to any effect of the LDD concentrations of the low-breakdown-voltage elements. This is advantageous to abrupt design changes. For example, it is possible to flexibly change breakdown voltages or to flexibly design a logic device containing flash memory cells.

FIGS. 8A and 9 are cross-sectional views showing the order of steps in a method of manufacturing a semiconductor device according to a third embodiment of the present invention. This embodiment is preferably also applied to a peripheral circuit of a flash EEPROM, and is conceived to enable separate design of LDD portions of high- and low-breakdown-voltage-element.

First, through steps the same as the corresponding ones of the first and second embodiments, N-well layers 302 for arranging PMOSFETs in a P-silicon substrate 301 are formed in both a high-breakdown-voltage-element area HBA and a low-breakdown-voltage-element area LBA. Then, an isolation oxide film 303 is formed, and a silicon oxide film 304 having a thickness of about 15 nm is further formed on the surface of the silicon substrate 301 (FIG. 8A).

Subsequently, through steps the same as the corresponding ones of the first and second embodiments, a gate electrode and wiring pattern 305 is formed by means of etching. Then, a resist pattern 306 is formed to cover at least positions corresponding to the PMOSFETs and the drain diffusion layer of a high-breakdown-voltage NMOSFET. Then, using the resist pattern 306 as a mask, phosphorous ions are implanted into the substrate 301 at an acceleration energy of 45 KeV and a dose of $1 \times 10^{14}/cm^2$ (FIG. 8B).

After the resist pattern 306 is removed, a resist pattern 307 is formed to have an opening only at a position corresponding to the drain diffusion layer of the high-breakdown-voltage NMOSFET. Then, using the resist pattern 307 as a mask, phosphorous ions are implanted into the substrate 301 at an acceleration energy of 45 KeV and a dose of $1 \times 10^{13}/cm^2$ (FIG. 9).

Following the above described steps, the steps shown in FIGS. 2B to 4B are performed to complete the peripheral circuit of the flash EEPROM, though detailed drawings showing these steps are omitted.

In the MOSFETs formed according to the third embodiment, the LDD concentrations of the drain diffusion layers of the high-breakdown-voltage elements are not influenced by the LDD concentrations of the source diffusion layers of the high-breakdown-voltage elements and the low-breakdown-voltage elements. As a result, a semiconductor device capable of operating at a high speed with a high reliability (a high breakdown voltage) can be flexibly realized without increasing its manufacturing cost.

Figure 4C:
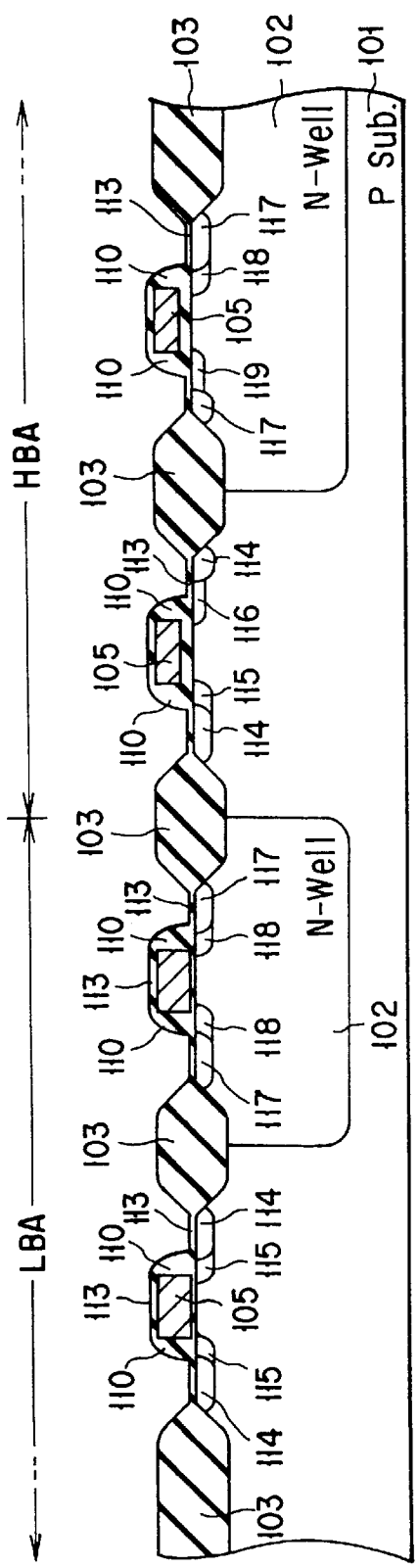
FIG. 4C is a cross-sectional view showing a modification of the first embodiment.

Note that, although the present invention is applied to both of the NMOSFETs and the PMOSFETs in the first to third embodiments, the present invention may be applied to either of the NMOSFETs or the PMOSFETs. Further, a preferable semiconductor device may be formed by arbitrarily combining the features of the present invention, such that the NMOSFETs of the first embodiment are combined with the PMOSFETs of the second or third embodiment, or the PMOSFETs of the first embodiment are combined with the NMOSFETs of the second or third embodiment. Further, the MOSFETs in the high-breakdown-voltage-element area HBA may have a gate insulating film having a thickness different from those of the MOSFETs in the low-breakdown-voltage-element area LBA. For example, as shown in FIG. 4C, a silicon oxide film having a thickness of about 15 nm may be used as a gate insulating film in the high-breakdown-voltage-element area HBA, while a silicon oxide film having a thickness of about 8 nm may be used as a gate insulating film in the low-breakdown-voltage-element area LBA. Furthermore, in addition to MOSFETs, the present invention may be similarly applied to MISFETs which employs a gate insulating film formed of an insulating film other than an oxide film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a low-breakdown-voltage-element area and a high-breakdown-voltage-element area on the same semiconductor substrate, and arranged in a peripheral circuit of a non-volatile memory, comprising:

(a) a first transistor in said low-breakdown-voltage-element area, formed of a field effect transistor of a first conductivity channel, and comprising
      a first source layer and a first drain layer formed in a common surface of said semiconductor substrate to interpose a first channel region therebetween in a first channel-length direction and have LDD portions of a conductivity type the same as that of said first source and drain layers and having a low carrier-impurity concentration, respectively, on sides facing each other, and
      a first gate electrode facing said first channel region through an insulating film,
      wherein said LDD portion of said first drain layer has a carrier-impurity concentration and a length in said first channel-length direction, the same as those of said LDD portion of said first source layer; and (b) a second transistor in said high-breakdown-voltage-element area, formed of a field effect transistor of a first conductivity channel, and comprising
      a second source layer and a second drain layer formed in said common surface of said semiconductor substrate to interpose a second channel region therebetween in a second channel-length direction and have LDD portions of a conductivity type the same as that of said second source and drain layers and having a low carrier-impurity concentration, respectively, on sides facing each other, and
      a second gate electrode facing said second channel region through an insulating film,
      wherein said LDD portion of said second drain layer has a lower carrier-impurity concentration and a longer length in said second channel-length direction, than those of said LDD portion of said second source layer.

2. The device according to claim 1, wherein said LDD portions of said first source and drain layers and said LDD portion of said second source layer have carrier-impurity concentrations substantially the same as each other.

3. The device according to claim 1, wherein said LDD portions of said first source and drain layers have carrier-impurity concentrations substantially the same as a difference in carrier-impurity concentrations between said LDD portions of said second source and drain layers.

4. The device according to claim 1, wherein said LDD portions of said first source and drain layers have lengths in said first channel-length direction, substantially the same as that of said LDD portion of said second source layer in said second channel-length direction.

5. The device according to claim 1, wherein insulating side walls are arranged on opposite sides of said second gate electrode above said LDD portions of said second source and drain layers, said LDD portion of said second source layer has a length substantially the same as that of one of said side walls thereabove in said second channel-length direction, while said LDD portion of said second drain layer has a length substantially larger than that of one of said side walls thereabove in said channel-length direction.

6. The device according to claim 1, further comprising:

(c) a third transistor in said low-breakdown-voltage-element area, formed of a field effect transistor of a second conductivity channel, said first and third transistors constituting a first complementary pair, said third transistor comprising
      a third source layer and a third drain layer formed in said common surface of said semiconductor substrate to interpose a third channel region therebetween in a third channel-length direction and have LDD portions of a conductivity type the same as that of said third source and drain layers and having a low carrier-impurity concentration, respectively, on sides facing each other, and
      a third gate electrode facing said third channel region through an insulating film,
      wherein said LDD portion of said third drain layer has a carrier-impurity concentration and a length in said third channel-length direction, the same as those of said LDD portion of said third source layer; and (d) a fourth transistor in said high-breakdown-voltage-element area, formed of a field effect transistor of a second conductivity channel, said second and fourth transistors constituting a second complementary pair, said fourth transistor comprising
      a fourth source layer and a fourth drain layer formed in said common surface of said semiconductor substrate to interpose a fourth channel region therebetween in a fourth channel-length direction and have LDD portions of a conductivity type the same as that of said fourth source and drain layers and having a low carrier-impurity concentration, respectively, on sides facing each other, and
      a fourth gate electrode facing said fourth channel region through an insulating film,
      wherein said LDD portion of said fourth drain layer has a lower carrier-impurity concentration and a longer length in said fourth channel-length direction, than those of said LDD portion of said fourth source layer.

7. The device according to claim 1, wherein said LDD portion of said second source layer has a depth substantially the same as that of said second source layer, and said LDD portion of said second drain layer has a depth smaller than that of said second drain layer.

8. The device according to claim 1, wherein said first gate electrode has side walls having lengths substantially the same as each other in said first channel-length direction, and said second gate electrode has side walls having lengths substantially the same as each other in said second channel-length direction.

* * * * *